United States Patent [19]

Ribnitz

[11] Patent Number: 4,816,285
[45] Date of Patent: Mar. 28, 1989

[54] METHOD AND APPARATUS FOR MEASURING A QUANTITY OF PARTICLES DEPOSITED ON A METAL BODY TO BE COATED WITH POWDER

[75] Inventor: Peter Ribnitz, St. Gallen, Switzerland

[73] Assignee: Prazisions-Werkzeuge AG, Ruti, Switzerland

[21] Appl. No.: 68,708

[22] Filed: Jun. 30, 1987

Related U.S. Application Data

[63] Continuation of Ser. No. 700,179, Feb. 11, 1985, abandoned.

[30] Foreign Application Priority Data

Feb. 10, 1984 [CH] Switzerland ............ 652/84

[51] Int. Cl.$^4$ .............. B05D 1/06; B05B 5/02; B05B 12/08
[52] U.S. Cl. .............. 427/10; 118/688; 118/712; 427/27; 427/28
[58] Field of Search .............. 427/10, 27, 28; 118/665, 688, 690, 712, 713

[56] References Cited

U.S. PATENT DOCUMENTS 3,374,112 3/1968 Danon .............. 427/10

Primary Examiner—Evan Lawrence
Attorney, Agent, or Firm—Antonelli, Terry & Wands

[57] ABSTRACT

A method and apparatus for measuring a quantity of particles deposited on a metal body to be coated with powder or the quantity of powder deposited per unit of time, especially on a moving body. The body is located in a space subjected to an electrostatic field and a quantity of powder deposited, possibly per unit of time, is measured by measuring a charge or current in a circuit connecting the field electrodes. An actual value deposited, indicated by a measurement, is used as a control parameter in a control circuit for adjusting an actual amount deposited to a set deposition amount which is adjustable.

23 Claims, 2 Drawing Sheets

METHOD AND APPARATUS FOR MEASURING A QUANTITY OF PARTICLES DEPOSITED ON A METAL BODY TO BE COATED WITH POWDER

This application is a Continuation of application Ser. No. 700,179, filed Feb. 11, 1985, now abandoned.

BACKGROUND OF THE INVENTION

The present invention relates to a method and apparatus for measuring the quantity of particles and, more particularly, to a method and apparatus for measuring the quantity of particles deposited on a metal body to be coated with a powder, wherein a high electrostatic field is applied between the body forming one electrode and a second electrode mounted at a distance or spacing therefrom, and wherein a particle current is introduced into the field space.

Several types of power coating methods have been proposed which may be used, for example, for corrosion proofing of welded seams on metal cans for, for example, accommodating food and, it is extremely important that a layer thickness be produced which is not adversely affected by disturbing factors which may take on various forms.

In one proposed method, where the body to be coated usually functions as an electrode, with a second electrode being mounted at a spacing or distance therefrom with the space for the high electrostatic field being formed therebetween one such factor is that not only the desired body coating is applied but also an undesired coating of the opposite electrode occurring as a result of changes of both polarities occurring in the field defined between the first and second electrode. This particular proposal produces an increasingly severe incrustation and corresponding changes in the electrostatic field leading, in turn, to a decrease in the quantity of powder deposited per unit of time on the body to be coated.

SUMMARY OF THE INVENTION

The aim underlying the present invention essentially resides in providing a method and apparatus whereby a deposition of powder on a body to be coated can be indirectly measured without actually measuring the thickness of the coating.

For this purpose, in accordance with advantages features of the method of the present invention, a charge shift in a circuit connecting the electrodes is measured. In this connection, considering the fact that a DC voltage source must be connected between the electrodes to generate an electrostatic field and that the field produced shift of the powder particles charged in the electrostatic field is equivalent to a current flow through a leak resistor between the electrodes which form a capacitor, it is possible that the particle current in the field space between the electrodes is measured as current in the electrical circuit connecting the electrodes. Thus, if one measures the electrical charge shift per unit of time in the electrical circuit, it is possible to obtain the quantity of particles deposited per unit of time.

Whereas in certain situations, it may be necessary to determine the absolute quantity of powder deposited on the body, as in monitoring the resultant layer thickness on the body mounted in a stationary position in the electrostatic field, with the measurement signal then being displayed as an indication of the total quantity deposited with the target, for example, to automatically shut off the coating apparatus when the thickness of the coating reaches a predetermined limit, it is particularly in arrangements in which a body is coated in a continuous pass through the field-filled space important to measure the charge shift per unit of time which is then significant for the layer thickness so that in this case the electric charge shift or flow per unit of time is then measured in the electrical circuit.

Advantageously, in accordance with the present invention, the above-noted charge shift per unit of time may be measured by measuring the voltage across a resistance element connected in the electrical circuit.

By virtue of the use of the measured signal as a measured regulated or controlled quantity in a feedback controlled circuit to control the quantity deposited per unit of time as a —finally—controlled quantity e.g. for the purpose of feedback controlling the thickness of a deposition layer on a body moved continuously at least in one motion component at right angles to the field, it is found that the layer thickness on the continuously coated bodies can be kept within close tolerances and any disturbing quantities are eliminated by known action of the feedback control.

Preferably, the quantity of powder introduced to the field per unit of time is used as an adjusting quantity whereby additionally or, alternatively, the field strength and/or the charge on the powder before it enters the field can be used as an adjusting quantity to adjust the controlled quantity to a value according to the control quantity, i.e., the quantity deposited per time unit according to a preselected quantity, the first being given by the measured voltage, the second by a preselected voltage. The later approach is used when a charging technique as known from smoke detectors is used, where powder is charged by, for example, a radioactive source with the corresponding polarity prior to entering the field space.

In accordance with advantageous features of the apparatus of the present invention, a charge measuring device is connected in an electrical circuit between the electrodes, with the charge measuring device being a device for measuring the charge flow as the primary quantity, a current-measuring device which determines the time derivative of the charge flow being also understood to be a charge flow measuring device.

Both the method and apparatus of the present invention are especially suitable for feedback controlling a layer thickness of coating on metal bodies coated with a powder in a continuous operation as used, for example, for coating interiors of welded seams on metal cans used in, for example, the food industry.

Accordingly, it is an object of the present invention to provide a method and apparatus for measuring and controlling either in the sense of regulating without feedback, or in the sense of feedback controlling, the quantity of particles deposited on a metal body to be coated with powder which avoids, by simple means, shortcomings and disadvantages encountered in the prior art.

Another object of the present invention resides in providing an apparatus for measuring a quantity of particles deposited on a metal body to be coated with powder which is simple in construction and therefore relatively inexpensive to manufacture.

A still further object of the present invention resides in providing a method and apparatus for measuring a quantity of particles deposited on a metal body to be indirectly measuring that quantity of powder coated with powder by means of measuring a quantity or a signal which is dependent of said quantity of powder but which can be accessed.

These and other objects, features, and advantages of the present invention will become more apparent from the following description when taken in connection with the accompanying drawings which show, for the purposes of illustration only, one embodiment in accordance with the present invention

DETAILED DESCRIPTION OF THE DISCLOSED EMBODIMENT

Figure 1:
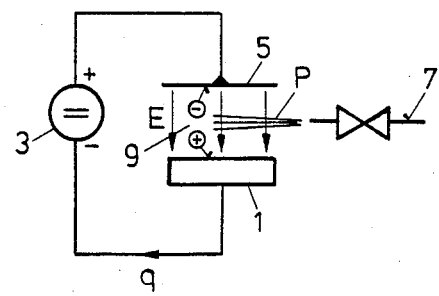
FIG. 1 is a schematic view of an electrostatic powder coating device constructed in accordance with the present invention to explain its principles.

Referring now to the drawings wherein like reference numerals are used throughout the various views to designate like parts, and, more particularly, to FIG. 1, according to this FIGURE, a body 1 to be coated is connected through a DC voltage source 3 which delivers a voltage of, for example, 70 kV to an opposite electrode 5 thereby resulting in the metal body 1 functioning as one of the electrodes. A supply line 7 supplies a spray powder P through a nozzle into a space filled by an electrostatic field E between the metal body 1 and the electrode 5. Initially and as a result of the high field strength E in the field space 9 defined between the electrode 5 and the body 1, the powder P is charged and, depending on the charge polarity, deposited on the body 1 or on the opposite electrode 5. The charge shift caused by the charged particles in the field space 9 causes a flow of a charge q in the circuit connecting the two electrodes, that is, the metal body 1 and opposite electrode 5 through the voltage source 3, with the electrical charge flow in the circuit connecting the electrodes 1, 5 being then measured to determine the quantity of powder deposited on the metal body 1

Figure 2:
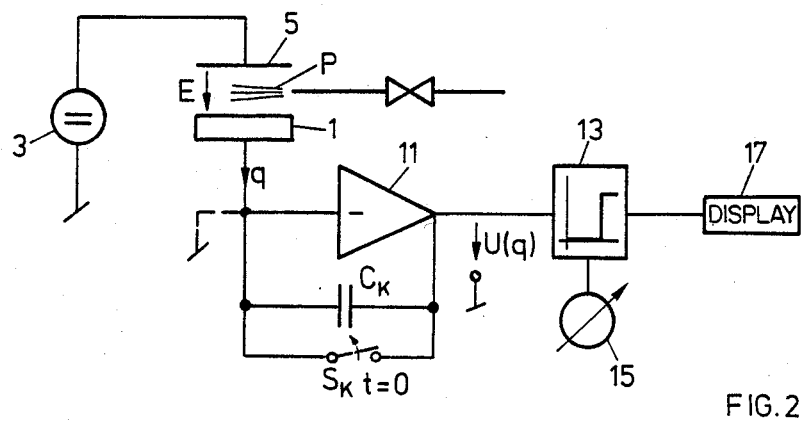
FIG. 2 is a schematic view of a charge-measuring device for use in the powder coating device of FIG. 1 for determining a total amount of powder deposited.

As shown most clearly in FIG. 2, a charge measuring device is deposited essentially in the circuit connecting the metal body 1 and the electrode 5 and, according to this FIGURE, the metal body 1, as one of the electrodes of the capacitor formed by it and the opposite electrode 5, is connected to an input of an operational amplifier 11 connected as a charge amplifier with a feedback capacitor $C_K$, The operational amplifier 11, in the inverting circuit configuration, places the metal body 1 at virtual ground potential and one terminal of the voltage source 3 is connected to ground. The negative-feedback capacitor $C_K$ of the charge-amplifier can be reset by a switch $S_K$. When the switch $S_K$ is closed and the DC voltage source 3 is switched on through the capacitor formed by the electrode 5 and the body 1, then the switch $S_K$ is opened, the charge amplifier measures the charge q flowing after this point in time through the circuit formed by the metal body 1, the electrode 5, and the DC voltage source 3. An output signal U(q) of the charge amplifier provides an indication of the charge q which has flown after the specified point in time, with the charge, in turn, representing a measure of the amount of powder deposited on the metal body 1 after the specified point in time i.e. opening moment of $S_K$.

From a time-derivative of the output signal U(q), that is, its increase or slope, build-up of the powder deposition as a function of time can be determined. If the output signal U(q) of the charge amplifier is fed to a comparator circuit 13, with a threshold value adjustable on a reference voltage source 15, an indicator signal for a display 17 appears at the output of the comparator 13 as soon as the output signal of the charge amplifier 11 reaches a value according to the reference value, that is, as soon as a certain layer thickness has been deposited on the metal body 1. WIth an arrangement such as illustrated in FIG. 2, it is possible to monitor on a stationary metal body 1 to be coated whether a specified layer thickness has been deposited thereon or not. However, in many applications, powder coating is performed on a continuously moving body, with a layer thickness on the moving body then being determined from knowledge of the travel speed of the body through the field filled space and from the amount of particle deposition per unit of time which, in turn, makes necessary a measurement of the electrical charge shift or flow per unit of time in the circuit between the electrode 5 and the metal body 1.

Figure 3:
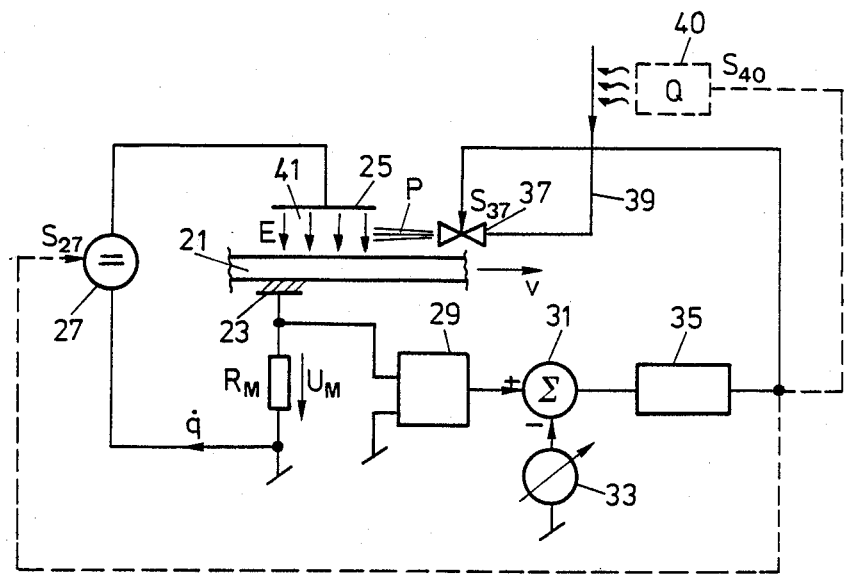
FIG. 3 is a schematic view of a device constructed in accordance with the present invention for measuring a quantity of powder deposited per unit of time on a body to be coated and for feedback controlling the thickness of the powder layer on a moving body.

As shown most clearly in FIG. 3 a body 21 to be coated is electrically contacted which is attained, for example, by sliding contacts or brushes. A DC voltage source 27 delivers a high DC voltage and is basically connected to both the electrode 25 and, through the sliding contact 23, to the moving body 21 which acts as the opposite electrode. If a charge flow per unit of time $q(=dg/dt)$ is to be measured in the circuit between the body 21 as one electrode and the electrode 25 as the other electrode, this is equivalent to measuring of a current. To measure the current, a measuring resistor $R_M$ is connected between the contact 23 to the body 21 and a reference potential, as ground potential, the voltage $U_M$ across the resistor $R_M$ being tapped off by a voltage measure device 29. The output voltage of the device 29, for example, an operational amplifier connected in follower configuration which corresponds to the voltage $U_M$ across the measuring resistor $R_M$, is then fed as a measured quantity to be controlled to a differential unit 31 having a second input to which a preferably adjustable control signal source 33 is connected. The output signal of the differential unit 31, which corresponds to the difference between the measured quantity to be controlled and the control quantity, and is thus the control difference quantity connected preferably through a controller 35 to a control input $S_{37}$ of an adjustable nozzle 37 provided in a supply line 39 for adjustably supplying powder to a field space 41 between the electrode 25 and the body 21 to be coated. By adjusting the nozzle 37, as an adjusting element in the feedback control circuit, the quantity of powder P sprayed per unit of time into the field space 41 is feedback controlled so that the current through the measuring resistor $R_M$ corresponds to the control signal or quantity from source 33 and, therefore, corresponds to a desired quantity of powder P deposited per unit of time on the body 21.

If, for example, disturbing factors such as an encrustation of the electrode 25 caused by a deposition of correspondingly charged powder particles results in a decrease in the amount deposited, the feedback control circuit then increases the quantity of powder P added to the field space 41 per unit of time in order to compensate for the disturbing factor. While it is preferable to use an adjustable nozzle 37 as adjusting element, it is also possible as indicated in phantom lines in FIG. 3 to employ the DC voltage source 27 when equipped with a control input $S_{27}$ as the adjusting element. An appropriate adjustment of the field generating voltage of the voltage source 27 is also useable for adjusting the amount of powder deposited per unit of time on the body 21.

The above description has been based upon the assumption that the powder P sprayed into the field space such as, for example, the field space 41, is charged primarily by an action of the high electrostatic field by, for example, an ionization phenomenon; however, the powder P can already be charged prior to its being dispensed into the field space 41 as is the case, for example, at smoke detectors, where smoke-gas is charged by means of radioactive sources. Thus it is also possible as indicated in phantom lines in FIG. 3, to charge the powder particles with a predetermined polarity by means of a radiation source 40 prior to the powder particles entering the field space 41 and, in this case, a tap can be provided for a control input $S_{40}$ for adjusting the radiation intensity of the source 40 and the radiation source 40 can then be used as the adjusting element.

Figure 4:
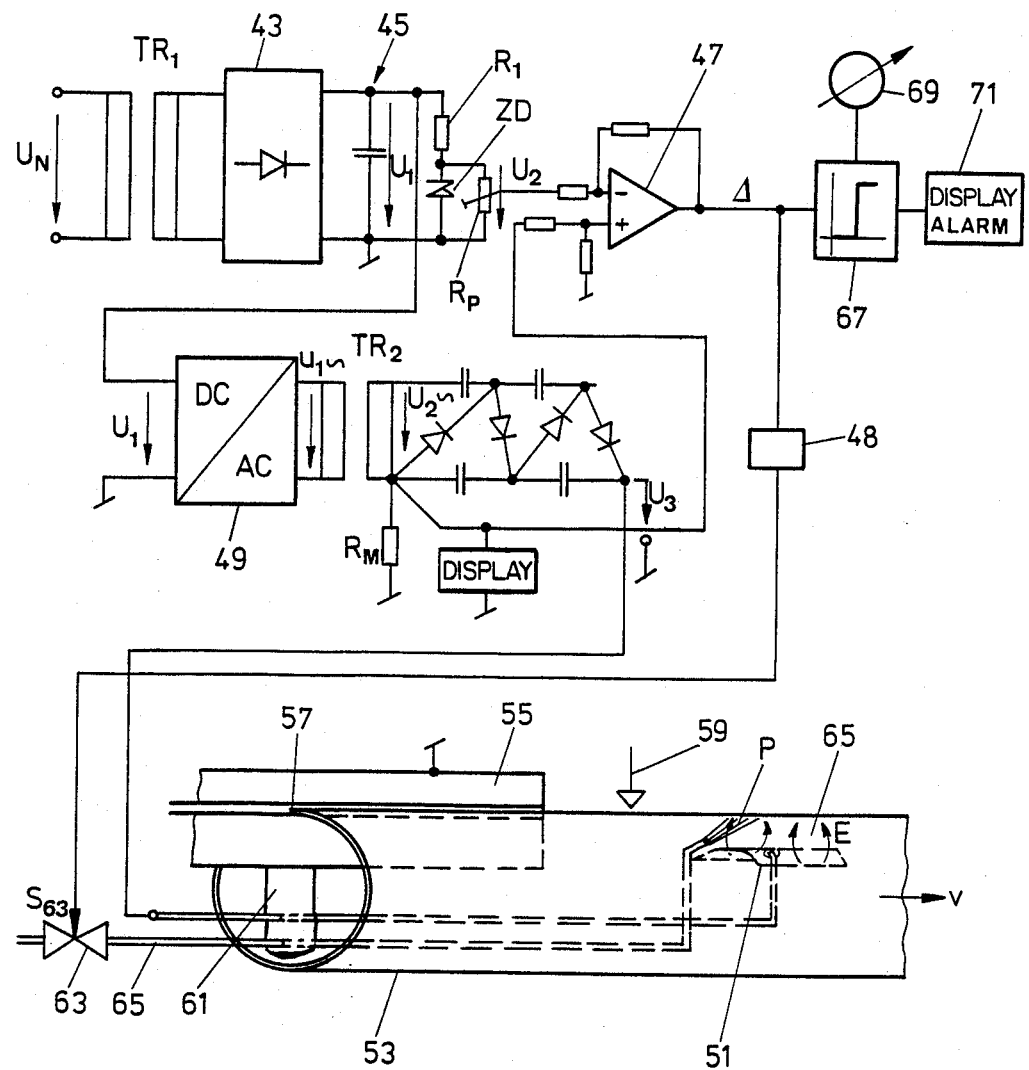
FIG. 4 is a preferred embodiment of an inventive layer-thickness feedback control - device constructed in accordance with the present invention for coating an interior of welded seams of sheet-metal cans.

FIG. 4 shows a preferred embodiment of construction in accordance with the present invention for controlling a layer thickness in coating of welded seams on interior of continuously manufactured metal can bodies such as, for example, can bodies used in the food industry. More particularly, as shown in FIG. 4, a line voltage $U_N$ is converted in a first transformer $TR_1$ which is followed by a rectifier and smoothing circuit 43, 45 into a DC voltage $U_1$, with a portion of the DC voltage $U_1$ being tapped off through a zener diode ZD with resistor $R_1$ connected in series therewith, as a now stabilized voltage $U_2$ and applied across a potentiometer $R_p$. A portion of the stabilized voltage $U_2$ is tapped off at the center of the potentiometer $R_p$ and is fed as one input to an operational amplifier 47 which functions as a differential amplifier. The DC voltage $U_1$ is converted on an output side into an alternating voltage $U_1$ by way of a DC/AC converter 49, with the voltage $U_1$ being connected to the primary side of a high voltage transformer $TR_2$. The secondary of the high voltage transformer $TR_2$ is connected on one side through a measuring resistor $R_M$ to a reference potential preferably a ground potential and a secondary voltage $u_2$ is stepped up using a conventional Greinacher-Villard type multiplying circuit and is connected as a high DC voltage $U_3$ to one electrode 51. A longitudinally extending internal welded seam of a tubular sheet metal body 53, initially shaped from an open sheet metal can body and then welded in a continuous operation is then coated in order to enable a manufacturing of the metal cans.

After passing through a shaping station (not shown) the sheet metal tube 53, not welded in the longitudinal direction, is fed to a guiding device 55 shaped, for example, as a conventional Z-shaped guide, wherein the still open edges of the sheet metal 57 are guided in position for a subsequent welding at the welding station 59. Generally, the edges 57 must be guided very precisely in the guide device 55 for subsequent welding so that an electrical contact between the guide 55 and the body 53 in a guide area is usually ensured without any additional provisions. However, in order to ensure a sufficient electrical low-ohmic connection, additional sliding or brush contacts maybe provided. The entire sheet metal body 53 is thus placed at a ground potential as a reference potential through the Z-shaped guide 55 with the electrode 51, as shown in FIG. 4, being electrically connected axially parallel to the axis of the body 53 and in an area in which the edges 57, which upstream the welding station 59, are already welded.

The electrode 51 with its associated guide or holder 61 is electrically insulated relative to the body 53 and the guide 55. An output of the differential amplifier 47 is fed, through an appropriately dimensioned controller 48, to a control input $S_{63}$ of an adjustable or controllable nozzle 63 in the line 65 for supplying the coating powder. The line 65, as the electrical feeding line for the electrode 51, extends axially parallel into the body 53 and sprays powder P into a field space 66 formed between the electrode 51 and the body 53.

With the above-described arrangement, the voltage $U_M$ is tapped off at a measuring resistor $R_M$ and is supplied to the differential amplifier 47 corresponding to the differential unit 31 in FIG. 3. A control value is preset on the potentiometer $R_p$, which corresponds to the control signal source 33 in FIG. 3, and, by comparing the control signal with the actual current value i.e. the controlled signal the control difference signal $\Delta$ appears at the output of the differential amplifier 47, which adjusts the adjustable or controllable nozzle 63. If even an adjustment of the nozzle 63 as the adjusting element to the limit of its adjusting scale cannot anymore control the actual current value measured at the measuring resistor $R_M$ to match the preset value set on the potentiometer $R_p$ as a result of, for example, a severe incrustation of the electrode 51, the control difference signal $\Delta$ appearing at the output of the differential amplifier 47 will increase. In order to indicate such conditions, the output of the differential amplifier 47 is connected to a comparator circuit 67 having a switching threshold value which is adjustable with a reference signal source 69 so that an indicating signal for a display and/or an alarm device 71 appears at the output of the comparator unit 67 when the control difference signal at the output of the differential amplifier 47 is above a value which can be set at the source 69.

While I have shown and described several embodiments in accordance with the present invention, it is understood that the same is not limited thereto but is susceptible to numerous changes and modifications as known to one having ordinary skill in the art, and I therefore do not wish to be limited to the details shown and described herein, but intend to cover all such modifications as are encompassed by the scope of the appended claims.

I claim:

1. A method of measuring quantity of coating particles deposited on a metal body to be coated with said particles, the method comprising the steps of producing a high electrostatic field between the body forming a first electrode and a second electrode with a distance between the first and second electrodes defining a field space, said field being produced by connecting said two electrodes to a high voltage circuit; providing a stream of charged coating particles in the field space including coating particles carrying charges of a polarity opposite that of the metal body to be coated, which coating particles are attracted to and deposited on said metal body, and measuring the charge flowing in said circuit while said particles are being deposited to determine the quantity of coating particles carrying said charges deposited on said body.

2. A method according to claim 1, wherein said charge flowing in said circuit is measured per time unit to determine said quantity of coating particles deposited per time unit.

3. A method according to claim 2, wherein said circuit interconnecting said two electrodes comprises a resistance, said charge flowing in said circuit per time unit being measured by measuring a voltage over said resistance.

4. A method according to claim 2, further comprising the steps of producing a signal dependent from said measured charge flowing per time unit as a controlled signal, producing a further signal as a control signal, producing a different signal from said signal and said further signal and controlling said quantity of coating particles deposited per time unit with said difference signal.

5. A method according to claim 4, further comprising controlling said quantity of coating particles deposited per time unit by controlling said stream of charge coating particles in said field space.

6. A method according to claim 5, further comprising controlling said stream by controlling the quantity of coating particles per time unit provided as said stream in the field space.

7. A method according to claim 5, further comprising controlling said stream by controlling the amount of said charges, carried by said coating particles.

8. A method according to claim 4, further comprising controlling said quantity of coating particles deposited per time unit by controlling said high electrostatic field.

9. A method according to claim 4, further comprising controlling said quantity of coating particles deposited per time unit by controlling a time span during which a metal body to be coated forms said first electrode.

10. A method according to claim 1, wherein said particles are powder particles.

11. A method of measuring a quantity of particles deposited on a metal body, the method comprising the steps of producing a high electrostatic field between the body forming a first electrode and a second electrode with a distance between the first and second electrodes defining a field space, said field being produced by connecting said two electrodes to a high voltage circuit; providing a stream of charged particles in the field space including particles carrying charges of a polarity opposite that of the metal body, which particles are attracted to and deposited on said metal body, and measuring the charge flowing in said circuit while said particles are being deposited to determine the quantity of particles carrying said charges deposited on said body.

12. An apparatus for measuring a quantity of coating particles deposited on a metal body comprising:
electrode means; charging means to charge said coating particles in one polarity of electric charge;
support means for said metal body to support said metal body distant from said electrode means;
applicator means to apply electrically charged coating particles between said electrode means and said support means for said metal body; and
electric circuit means connected to said electrode means and connectable to said metal body to apply a high voltage between said electrode means and said metal body to generate a high electric field between said electrode means and said metal body so as to attract said charged coating particles towards said metal body, said electric circuit means comprising charge measuring means to measure an amount of electric charge flowing between said electrode means and said metal body through said electric circuit means, and thereby to measure the quantity of coating particles deposited on the metal body.

13. An apparatus according to claim 12, wherein said charge measuring means including current measuring means.

14. An apparatus according to claim 13, wherein said current measuring means comprises resistance means and voltage measuring means to measure a voltage on said resistance means caused by said amount of electric charge flowing per unit of time.

15. An apparatus according to claim 13, further comprising a control unit to control the quantity of coating particles deposited on said metal body and a control signal generator means generating a control signal; said current measuring means generating an output signal as a controlled signal in dependency from said electric charge flowing per unit of time; said controlled signal and said control signal being connected to a difference unit which generates a control deviation signal in dependency of the difference between said control and said controlled signals; said control deviation signal being connected to the input of said control unit.

16. An apparatus according to claim 15, wherein said control unit comprises controlled feed means for controlling the quantity of said coating particles applied between said electrode means and said support means.

17. An apparatus according to claim 15, wherein said control unit comprises said charging means for controlling the amount of charge of said coating particles applied between said electrode means and said support means.

18. An apparatus according to claim 15, wherein said control unit comprises adjusting means within said electric circuit for the high voltage between said electrode means and said metal body.

19. An apparatus according to claim 13, wherein said control unit comprises a time control means for controlling the amount of time of said deposition of coating particles on said metal body.

20. An apparatus according to claim 12, further comprising conveyor means to continuously move said metal body along said electrode means.

21. An apparatus according to claim 12, wherein said applicator means comprises means for internally coating tube-like metal bodies.

22. An apparatus according to claim 12, wherein said particles are powder particles.

23. An apparatus for measuring a quantity of particles deposited on a metal body comprising:
electrode means;
charging means to charge said particles in one polarity of electric charge;
support means for said metal body to support said metal body distant from said electrode means;
applicator means to apply electrically charged particles between said electrode means and said support means for said metal body; and electric circuit means connected to said electrode means and connectable to said metal body to apply a high voltage between said electrode means and said metal body to generate a high electric field between said electrode means and said metal body so as to attract said charged particles towards said metal body, said electric circuit means comprising charge measuring means to measure an amount of electric charge flowing between said electrode means and said metal body through said electric circuit means, and thereby to measure the quantity of particles deposited on the metal body.

* * * * *